United States Patent
Suzuki (10) Patent No.: US 8,031,259 B2
(45) Date of Patent: Oct. 4, 2011

(54) SOLID-STATE IMAGING DEVICE AND ELECTRONIC CAMERA

(75) Inventor: Satoshi Suzuki, Tokyo (JP)

(73) Assignee: Nikon Corporation, Tokyo (JP)

(*) Notice: Subject to any disclaimer, the term of this patent is extended or adjusted under 35 U.S.C. 154(b) by 503 days.

(21) Appl. No.: 12/292,619

(22) Filed: Nov. 21, 2008

(65) Prior Publication Data
US 2009/0213255 A1 Aug. 27, 2009

Related U.S. Application Data

(60) Provisional application No. 61/064,436, filed on Mar. 5, 2008.

(30) Foreign Application Priority Data

Nov. 22, 2007 (JP) ................................. 2007-302797

(51) Int. Cl.
*H04N 5/232* (2011.01)
(52) U.S. Cl. ...................................................... 348/350
(58) Field of Classification Search .................. 348/350, 348/345, 349, 308, 294, 302, 303, 304, 305; 341/164, 155; 250/208.1; 396/121, 123
See application file for complete search history.

(56) References Cited

U.S. PATENT DOCUMENTS

| 7,629,914 B2* | 12/2009 | Muramatsu et al. ........... 341/164 |
| 7,746,399 B2* | 6/2010 | Itoh et al. ....................... 348/302 |
| 2007/0153112 A1 | 7/2007 | Ueda et al. |
| 2007/0153113 A1 | 7/2007 | Ueda et al. |
| 2007/0153114 A1 | 7/2007 | Ueda et al. |

FOREIGN PATENT DOCUMENTS

| JP | A-2000-004406 | 1/2000 |
| JP | A-2001-036920 | 2/2001 |
| JP | A-2001-298748 | 10/2001 |
| JP | A-2003-244712 | 8/2003 |
| JP | A-2006-071741 | 3/2006 |
| JP | A-2006-261929 | 9/2006 |
| JP | A-2007-184912 | 7/2007 |

\* cited by examiner

*Primary Examiner* — Hung Dang
(74) *Attorney, Agent, or Firm* — Oliff & Berridge, PLC (57) ABSTRACT

A solid-state imaging device includes a plurality of pixels disposed in a two-dimensional array, a scanning circuit that selects a specific pixel among the pixels by selecting a pixel row and a pixel column and a signal output circuit that outputs a signal from the pixel selected by the scanning circuit. The plurality of pixels include a plurality of first focus detection pixels and a plurality of second focus detection pixels. The first focus detection pixels and the second focus detection pixels are disposed within a single row or a single column. The scanning circuit selects a plurality of first or second focus detection pixels disposed within the single row or column at once. The signal output circuit combines signals from the plurality of first or second focus detection pixels selected by the scanning circuit and outputs a resulting composite signal.

8 Claims, 10 Drawing Sheets

SOLID-STATE IMAGING DEVICE AND ELECTRONIC CAMERA

This non-provisional application claims the benefit of U.S. Provisional Application No. 61/064,436 filed Mar. 5, 2008. This application also claims priority from Japanese Application No. 2007-302797 filed Nov. 22, 2007. The disclosure of each of the earlier applications is incorporated herein by reference in its entirety.

BACKGROUND OF THE INVENTION

1. Field of the Invention

The present invention relates to a solid-state imaging device and an electronic camera equipped with the solid-state imaging device.

2. Description of Related Art

Video cameras and electronic cameras are among the most popular consumer electronic products used by ordinary consumers today. These cameras are equipped with solid-state imaging devices such as CCD sensors and CMOS sensors. Such a solid-state imaging device includes a plurality of pixels, which generate signal charges in correspondence to the quantity of incoming light, disposed in a matrix pattern. The signal charges having been generated at the individual pixels or electrical signals corresponding to the signal charges are output to an external recipient device via vertical signal lines or the like, each installed in correspondence to a pixel column, in conformance to a drive signal output from a scanning circuit in response to an instruction issued by a timing signal generator.

Such a solid-state imaging device in the known art may also be capable of functioning as a focus detection device engaged in focus detection executed by adopting a split-pupil phase difference method (see Japanese Laid Open Patent Publication No. 2003-244712). This type of solid-state imaging device includes focus detection pixels disposed in addition to imaging pixels that output imaging signals to be used to form image signals expressing the subject image. The focus detection is executed through the split-pupil phase difference method by detecting the extent of image shift manifested by a pair of images formed with light fluxes having passed through the photographic lens at different positions based upon signals output from the focus detection pixels.

There is also a camera known in the related art that provides a live view display by displaying at a liquid crystal monitor a real-time motion picture of the subject image captured via a solid-state imaging device (see Japanese Laid Open Patent Publication No. 2007-184912).

When a solid-state imaging device such as that described above is engaged in focus detection while a live view is displayed, it may not always be possible to execute exposure over the length of time required to enable optimal focus detection. Namely, the image signals from the individual pixels must be output at a predetermined frame rate in order to display a motion picture in the live view display. However, if the photographing operation is being executed in a dark environment, for instance, light may not be received at the focus detection pixels in sufficient quantity to assure accurate detection of the extent of image shift manifested by the pair of images over the exposure period corresponding to the frame rate, resulting in failure in executing accurate focus detection.

SUMMARY OF THE INVENTION

A solid-state imaging device according to a first aspect of the present invention includes a plurality of pixels disposed in a two-dimensional array, a scanning circuit that selects a specific pixel among the pixels by selecting a pixel row and a pixel column and a signal output circuit that outputs a signal from the pixel selected by the scanning circuit. In this solid-state imaging device, the plurality of pixels include a plurality of first focus detection pixels at each of which a light flux having passed through a first area of an exit pupil of an imaging optical system is received and a plurality of second focus detection pixels at each of which a light flux having passed through a second area of the exit pupil of the imaging optical system, different from the first area, is received, both used as focus detection pixels that output signals to be used to detect a focusing condition of the imaging optical system. The first focus detection pixels and the second focus detection pixels are disposed within a single row or a single column. In addition, the scanning circuit selects a plurality of first focus detection pixels disposed within the single row or column at once and a plurality of second focus detection pixels disposed within the single row or column at once. Furthermore, the signal output circuit combines signals from the plurality of first focus detection pixels selected by the scanning circuit and outputs a resulting composite signal, and also combines signals from the plurality of second focus detection pixels selected by the scanning circuit and outputs a resulting composite signal.

According to a second aspect of the present invention, in the solid-state imaging device of the first aspect, the plurality of pixels also include imaging pixels that output signals to be used to capture an image formed through the imaging optical system. In this solid-state imaging device, it is preferable that the first focus detection pixel and the second focus detection pixel are alternately disposed with at least one imaging pixel disposed therebetween within the single row or column.

According to a third aspect of the present invention, in the solid-state imaging device of the second aspect, the pixels each correspond to a specific color among red, green and blue. In this solid-state imaging device, it is preferable that a first focus detection pixel corresponding to green and a second focus detection pixel corresponding to green are alternately disposed with an imaging pixel corresponding to either red or blue disposed therebetween within the single row or column.

According to a fourth aspect of the present invention, in the solid-state imaging device of the first aspect, it is preferable that the scanning circuit selects specific pixel columns simultaneously when it has selected a row having the first focus detection pixels and the second focus detection pixels disposed therein and also selects pixel columns that are different from the specific pixel columns simultaneously when it has selected a row with no first focus detection pixels or second focus detection pixels disposed therein.

According to a fifth aspect of the present invention, in the solid-state imaging device of the first aspect, it is preferable that the scanning circuit selects specific pixel rows simultaneously when it has selected a column having the first focus detection pixels and the second focus detection pixels disposed therein and also selects pixel rows that are different from the specific pixel rows simultaneously when it has selected a column with no first focus detection pixels or second focus detection pixels disposed therein.

According to a sixth aspect of the present invention, in the solid-state imaging device of the first aspect, it is preferable that the first area and the second area assume a left/right positional relationship or an up/down positional relationship relative to the exit pupil of the imaging optical system.

An electronic camera according to a seventh aspect of the present invention includes a solid-state imaging device of the first aspect.

According to an eighth aspect of the present invention, it is preferable that the electronic camera of the seventh aspect further includes a display means for bringing up a live view display of an image formed through the imaging optical system based upon a composite signal generated by further combining a composite signal of the signals from the plurality of first focus detection pixels having been combined via the signal output circuit and a composite signal of the signals from the plurality of second focus detection pixels having been combined via the signal output circuit.

DESCRIPTION OF PREFERRED EMBODIMENT

The following is a description of an embodiment of the solid-state imaging device according to the present invention, given in reference to the drawings.

Figure 1:
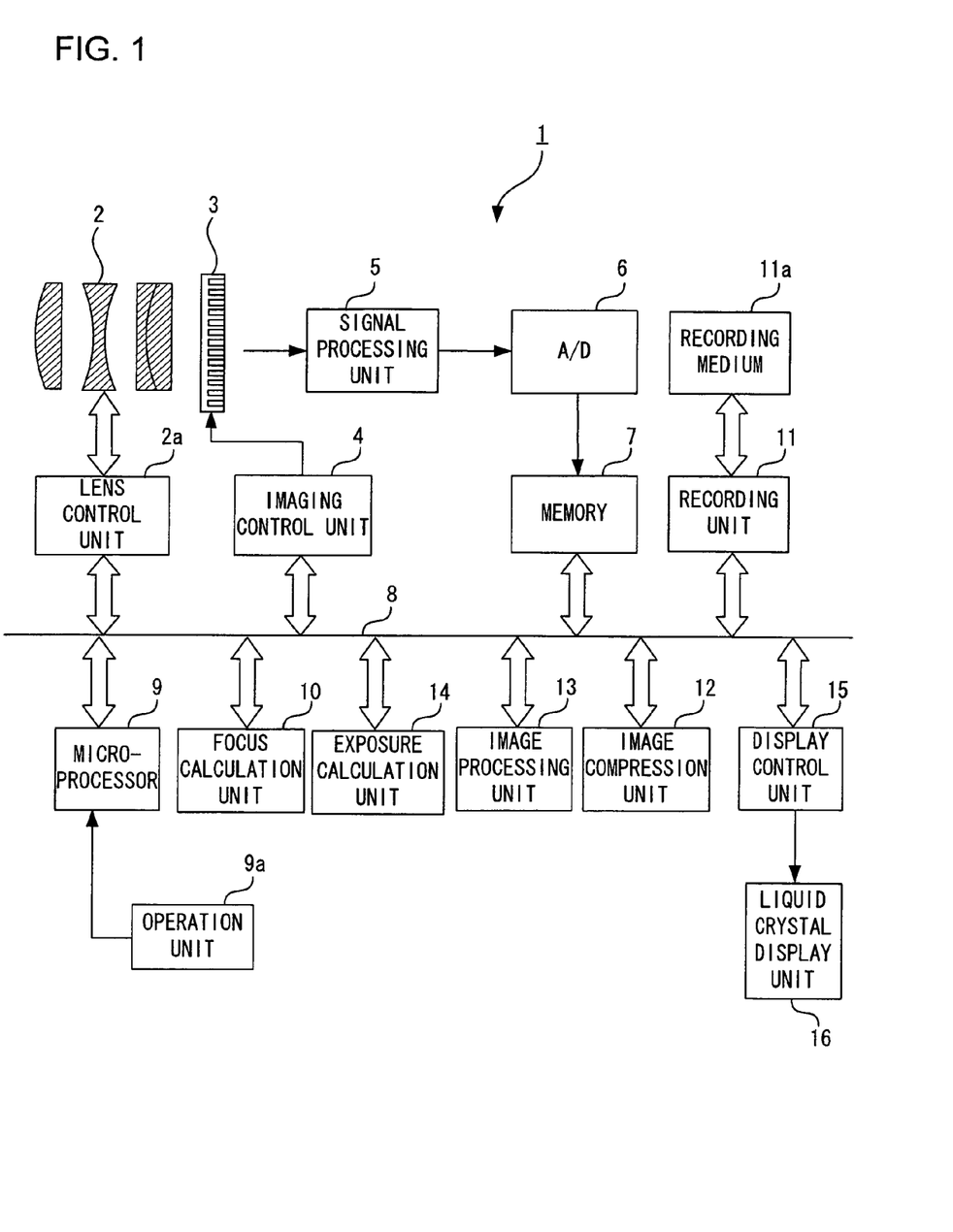
FIG. 1 is a block diagram showing the structure adopted in an electronic camera equipped with the solid-state imaging device achieved in an embodiment of the present invention.

FIG. 1 is a block diagram of an electronic camera 1 equipped with the solid-state imaging device achieved in the embodiment of the present invention. A photographic lens 2 constituting an imaging optical system is mounted at the electronic camera 1. The focus and the aperture of the photographic lens 2 are driven via a lens control unit 2a. A solid-state image sensor 3 is disposed at a position corresponding to the plane of the image formed via the photographic lens 2.

The solid-state image sensor 3 outputs signals as it is driven in response to a command issued by an imaging control unit 4. The solid-state image sensor 3 outputs imaging signals used to form image signals expressing a subject image and focus detection signals used to detect the focusing state of the photographic lens 2. Some of the imaging signals may be used as photometry information for automatic exposure. Both types of signals first undergo processing at a signal processing unit 5 and an A/D conversion unit 6 and are then temporarily stored into a memory 7. The memory 7 is connected to a bus 8. The lens control unit 2a, the imaging control unit 4, a microprocessor 9, a focus calculation unit 10, an exposure calculation unit 14, a recording unit 11, an image compression unit 12, an image processing unit 13, a display control unit 15 and the like, too, are connected to the bus 8. The display control unit 15 brings up a live view monitor image or the like at a liquid crystal display unit (LCD) 16. An operation unit 9a such as a shutter release button is connected to the microprocessor 9. In addition, a recording medium 11a is detachably loaded into the recording unit 11. The solid-state image sensor 3, the imaging control unit 4, the signal processing unit 5 and the like together constitute the solid-state imaging device in the embodiment of the present invention.

Figure 2:
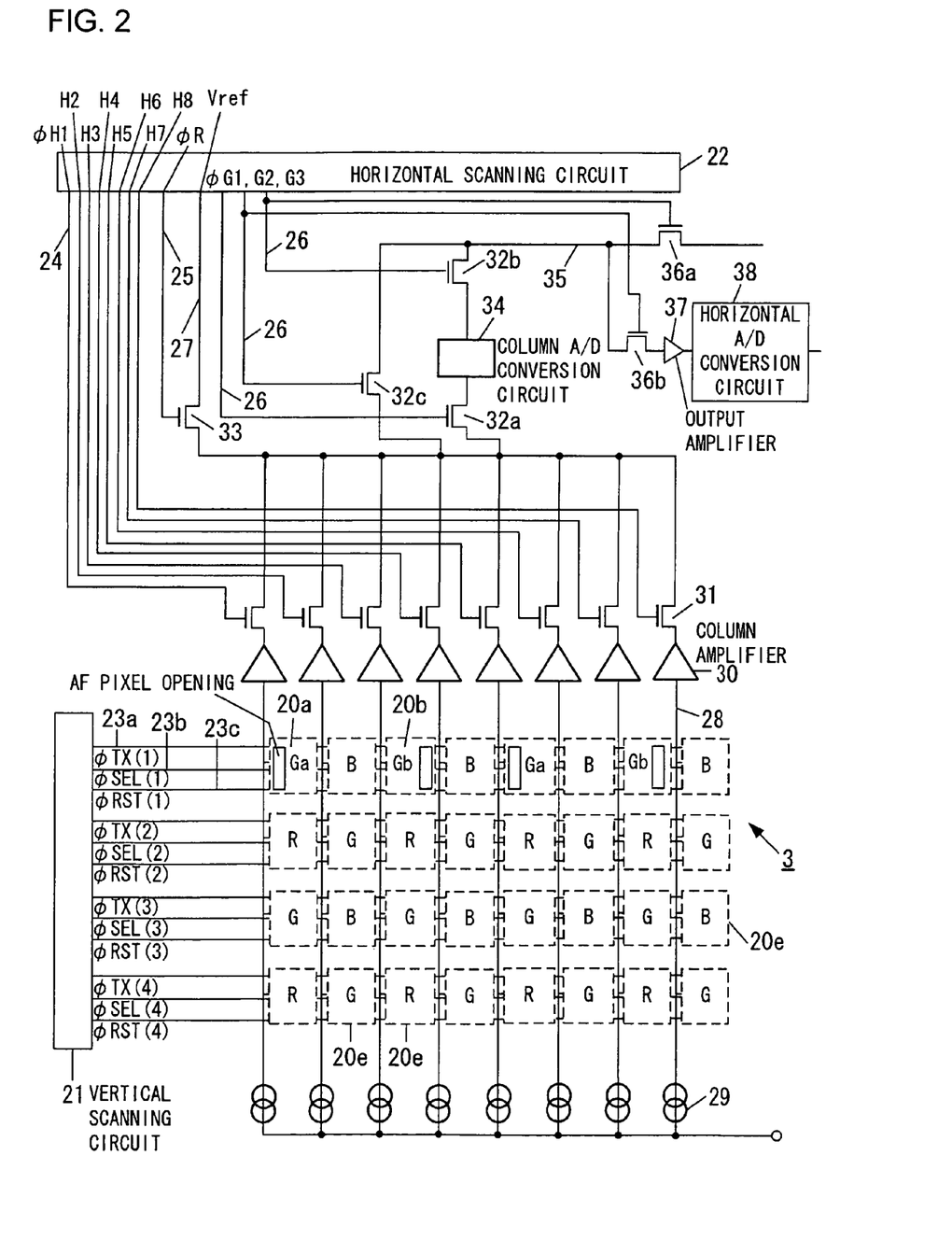
FIG. 2 is a circuit diagram schematically illustrating the structure of the solid-state image sensor in FIG. 1.

FIG. 2 is a circuit diagram schematically illustrating the structure of the solid-state image sensor 3 in FIG. 1. The solid-state image sensor 3 includes a plurality of pixels 20 disposed in a two-dimensional matrix pattern and peripheral circuits through which signals from the pixels 20 are output. FIG. 2 shows 32 pixels disposed in four columns set side-by-side in the horizontal direction and in eight rows side-by-side in the vertical direction. Obviously the solid-state image sensor in the embodiment actually includes a great many more than 32 pixels, and the present invention may be adopted in conjunction with any number of pixels.

The solid-state image sensor 3 in the embodiment includes imaging pixels 20e and focus detection pixels (hereafter may be referred to as "AF pixels") 20a, 20b, 20c and 20d. The imaging pixels 20e output signals used to capture an image formed through the photographic lens 2, i.e., image signals expressing a subject image formed through the photographic lens 2. The focus detection pixels 20a~20d output focus detection signals used in focus detection executed for the photographic lens 2, i.e., used to detect the focusing state of the photographic lens 2, through a split-pupil phase difference method. It is to be noted that these pixels may be all summarily referred to as pixels 20 in the following description FIG. 2 shows imaging pixels 20e each corresponding to one of; R (red), G (green) and B (blue) and AF pixels 20a and 20b all corresponding to G. However, AF pixels 20c and 20d corresponding to G are also disposed at the solid-state image sensor 3. The specific circuit structure and the structural elements of these pixels are to be described in detail later.

The pixels 20 each output either an imaging signal or a focus detection signal in response to a drive signal provided from a peripheral circuit. An electronic shutter operation may be executed so that the photoelectric conversion units at all the pixels 20 are simultaneously reset and the pixels 20 are all exposed over equal lengths of time with matching timing, or an electronic shutter operation may be executed through a rolling shutter operation, whereby signals are read out from one row at a time.

The peripheral circuits at the solid-state image sensor 3 include a vertical scanning circuit 21, a horizontal scanning circuit 22, drive signal lines 23a~23c and 24~26, a reference signal line 27, vertical signal lines 28, constant current sources 29, column amplifiers 30, front-stage switches 31, rear-stage switches 32a~32c, a reset switch 33, a column A/D conversion circuit 34, a horizontal signal line 35, output switches 36a and 36b, an output amplifier 37 and a horizontal A/D conversion circuit 38.

The vertical scanning circuit 21 scans the pixels 20 along the vertical direction and selects a specific pixel row. The horizontal scanning circuit 22 scans the pixels 20 along the horizontal direction and selects a specific pixel column. In addition, the horizontal scanning circuit selects a specific A/D conversion method, either column A/D conversion or horizontal A/D conversion to be detailed later, through which the analog signals output from the pixels 20 are to be converted to digital signals. The drive signal lines 23a~23c are all connected to the vertical scanning circuit 21, whereas the drive signal lines 24~26 and the reference signal line 27 are all connected to the horizontal scanning circuit 22. The vertical signal lines 28 are each installed in correspondence to one of the columns along which the pixels 20 are disposed, and through the vertical signal lines 28, the pixel signal each output from one of the pixels 20 are transferred. The vertical signal lines 28 are each connected to a constant current source 29 and a column amplifier 30. The imaging signals or the focus detection signals output from the pixels 20 in the row selected by the vertical scanning circuit 21 are amplified in correspondence to the individual columns of pixels 20 at the column amplifiers 30 and are then output. The front-stage switches 31, the rear-stage switches 32a~32c, the reset switch 33 and the output switches 36a and 36b are each constituted with a transistor. A scanning circuit according to an embodiment of the present invention consists of the vertical scanning circuit 21 and the horizontal scanning circuit 22, a signal output circuit according to an embodiment of the present invention consists of other peripheral circuits.

A set of the vertical signal line 28, the constant current source 29, the column amplifier 30 and the front-stage switch 31 is disposed in conjunction with each column of pixels 20 in the embodiment. On the other hand, a common set of the rear-stage switches 32a~32c, the reset switch 33 and the column A/D conversion circuit 34 is installed in conjunction with eight columns of pixels 20 making up each pixel group. It is to be noted that while FIG. 2 shows a single group made up with eight pixel columns, numerous groups, each adopting a circuit structure similar to that shown in FIG. 2, are disposed at actual the image sensor. One end of each front-stage switch 31 is connected to the corresponding column amplifier 30, whereas the other ends of the front-stage switches are commonly connected to one ends of the rear-stage switches 32a and 32c and the reset switch 33.

Drive signals ΦH (ΦH1~ΦH8) generated from the horizontal scanning circuit 22 are input to the gates of the individual front-stage switches 31 via the drive signal lines 24. The on-off operation at each front-stage switch 31 is thus controlled based upon the corresponding drive signal ΦH. Drive signals ΦG (ΦG1~ΦG3) generated from the horizontal scanning circuit 22 are input to the gates of the rear-stage switches 32a~32c and the output switches 36a and 36b via the drive signal lines 26. The on-off operation at each of the rear-stage switches 32a~32c and the output switches 36a and 36b is thus controlled based upon the corresponding drive signal ΦG. A drive signal ΦR generated from the horizontal scanning circuit 22 is input to the gate of the reset switch 33 via the drive signal line 25. The on-off operation at the reset switch 33 is thus controlled based upon the drive signal ΦR.

The other end of the rear-stage switch 32a is connected to the column A/D conversion circuit 34. As the rear-stage switch 32a is turned on, the column A/D conversion circuit 34 converts an analog signal, either an imaging signal or a focus detection signal, having been output from a pixel 20 selected via the vertical scanning circuit 21, among the pixels 20 in the column connected to the vertical signal line 28 selected via the corresponding front-stage switch 31 and having been amplified via the column amplifier 30, to a digital signal. Then, as the rear-stage switch 32b is turned on, the digital signal resulting from the conversion is output to the horizontal signal line 35. At this time, the output switch 36a is simultaneously turned on and thus, the digital signal is output from the solid-state image sensor 3. The conversion method described above, through which the column A/D conversion circuit 34 is engaged in operation to convert the imaging signals or focus detection signals from pixels 20 to digital signals in correspondence to each group made up with eight columns of pixels 20, is hereafter referred to as column A/D conversion.

Through the column A/D conversion executed via the column A/D conversion circuit 34 as described above, an analog signal output from each pixel 20 can be converted to a digital signal and then this digital signal can be output. During this process, a plurality of front-stage switches 31 may be turned on at once so as to execute horizontal pixel summing, whereby signals output from a plurality of pixels 20 are added together along the row direction (i.e., over different columns) in the columns of pixels 20 belonging to the same group and then output. Such horizontal pixel summing executed within a given group of pixels is hereafter referred to as group internal horizontal pixel summing. Alternatively, the signals from the pixels 20 disposed side-by-side along the row direction may be read out separately from each other without executing the group internal horizontal pixel summing.

The other end of the rear-stage switch 32c is directly connected to the horizontal signal line 35 by bypassing the column A/D conversion circuit 34. As the rear-stage switch 32c is turned on, the analog imaging signal or the analog focus detection signal output from the pixel 20 selected via the vertical scanning circuit 21, among the pixels 20 in the column connected to the vertical signal line 28 selected via the corresponding front-stage switch 31, and amplified at the column amplifier 30 is directly output to the horizontal signal line 35 without undergoing digitization. As the output switch 36b is also turned on simultaneously, the analog signal is amplified at the output amplifier 37 and is input to the horizontal A/D conversion circuit 38. The horizontal A/D conversion circuit 38 converts the analog signal output from the output amplifier 37 to a digital signal. The digital signal resulting from the conversion at the horizontal A/D conversion circuit 38 is then output from the solid-state image sensor 3. The conversion method described above, through which the analog imaging signal or the analog focus detection signal output from a pixel 20 to the horizontal signal line 35 is converted to a digital signal via the horizontal A/D conversion circuit 38, is hereafter referred to as horizontal A/D conversion.

Through the horizontal A/D conversion executed via the horizontal A/D conversion circuit 34 as described above, an analog signal output from each pixel 20 can be converted to a digital signal and then this digital signal can be output. During this process, a plurality of front-stage switches 31 may be turned on at once so as to execute the group internal horizontal pixel summing described earlier, whereby signals output from a plurality of pixels 20 are added together along the row direction (i.e., over different columns) in the columns of pixels 20 belonging to the same group and then output. In addition, for the columns of pixels 20 belonging to different groups, front-stage switches 31 and rear-stage switches 32c installed in conjunction with the groups may be turned on simultaneously to execute horizontal pixel summing whereby the signals from a plurality of pixels 20 are added together along the row direction (i.e., over different columns) and then output. The horizontal pixel summing executed to add up signals from pixels in different groups as described above is to be referred to as group-to-group horizontal pixel summing in the following description. Alternatively, the signals from the pixels 20 disposed side-by-side along the row direction may be read out separately from each other without executing the group internal horizontal pixel summing or the group-to-group horizontal pixel summing.

A reference voltage Vref is input from the horizontal scanning circuit 22 to the other end of the reset switch 33 via the reference signal line 27. This reference voltage Vref is used when resetting the input voltage provided to the column A/D conversion circuit 34 or the output amplifier 37. Before selecting a different column of pixels 20, i.e., a different column amplifier 30, via the corresponding front-stage switch 31, the reset switch 33 is turned on so as to reset the input voltage to the column A/D conversion circuit 34 or the output amplifier 37 to the reference voltage Vref. Then, front-stage switches 31 are switched to select the different column of pixels 20. Through these measures, the input voltage is prevented from being mixed with a signal from a pixel 20 belonging to the previously selected column.

As described above, as the horizontal scanning circuit 22 executes control so as to turn on either the rear-stage switch 32a or the rear-stage switch 32c, either the column A/D conversion or the horizontal A/D conversion is selected. Then, either an imaging signal or a focus detection signal, output from a pixel 20 belonging to a row selected by the vertical scanning circuit 21 and also belonging to the column selected by the horizontal scanning circuit 22 by controlling the corresponding front-stage switch 31, is converted to a digital signal either via the column A/D conversion circuit 34 or via the horizontal A/D conversion circuit 38 and the digitized signal is output from the solid-state image sensor 3.

It is to be noted that regardless of which A/D conversion method, i.e., the column A/D conversion or the horizontal A/D conversion, is selected, group internal horizontal pixel summing, whereby the sum obtained by adding, along the row direction, signals from a plurality of pixels 20 within a given group, is output, can be executed by turning on a plurality of front-stage switches 31 all at once. In addition, if the horizontal A/D conversion is selected, the group-to-group horizontal pixel summing, whereby the sum obtained by adding along the row direction signals from a plurality of pixels 20 belonging to different groups, is output, can be executed by turning on a plurality of rear-stage switches 32c belonging to the different groups all at once and also turning on a specific front-stage switch 31 in each group. It is desirable to select the column A/D conversion when executing the group internal horizontal pixel summing, whereas it is desirable to select the horizontal A/D conversion when executing group-to-group horizontal pixel summing.

It is to be noted that the number of columns of pixels 20 making up each group is not limited to eight, as in the example described above, and may be made up any number of columns. Namely, the number of pixels, the signals from which undergo horizontal pixel summing through the group internal horizontal pixel summing, is not limited to that in the example explained above and any desirable number of pixels may be set for the horizontal pixel summing. It will be obvious that any desirable number of pixels may also be set for the horizontal pixel summing executed in the group-to-group horizontal pixel summing. It will also be obvious that a circuit structure other than that described above may be adopted to allow selective execution of horizontal pixel summing.

Figure 3:
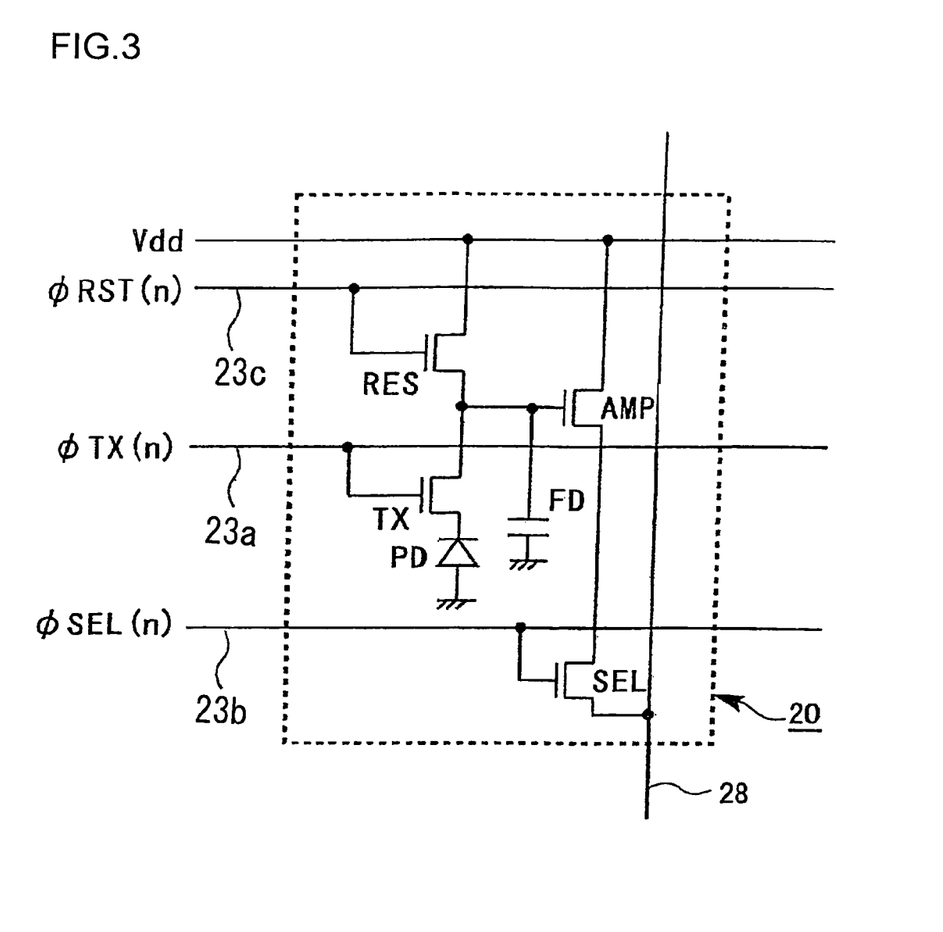
FIG. 3 is a circuit diagram showing the circuit structure adopted in the pixels constituting the solid-state image sensor in FIG. 1.

The pixels 20, i.e., the pixels 20a, 20b, 20c, 20d and 20e all assume substantially identical circuit structures. FIG. 3 is a circuit diagram of a pixel 20 in the solid-state image sensor 3 in FIG. 1.

As do the pixels in a standard CMOS solid-state image sensor, the pixels 20 each include a photodiode PD, a floating diffusion FD, an amplifier transistor AMP, a transfer transistor TX, a reset transistor RES and a selector transistor SEL. The photodiode PD functions as a photoelectric conversion unit that generates and accumulates a signal charge corresponding to the incoming light. The floating diffusion FD functions as a charge/voltage conversion unit that takes in the signal charge accumulated at the photodiode PD and converts the signal charge thus received to a voltage. The amplifier transistor AMP functions as an amplifier unit that outputs a signal corresponding to the potential at the floating diffusion FD. The transfer transistor TX functions as a charge transfer unit that transfers the charge from the photodiode PD to the floating diffusion FD. The reset transistor RES functions as a reset unit that resets the potential at the floating diffusion FD. The selector transistor SEL functions as a selector unit that selects the particular pixel 20. The individual units are connected as illustrated in FIG. 3. It is to be noted that the transistors AMP, TX, RES and SEL at the pixel 20 are each constituted with an nMOS transistor in the embodiment. Vdd in FIG. 3 indicates the source voltage.

The gates of the transfer transistors TX at the pixels in each row are connected to the drive signal line 23a corresponding to the particular row. Through the drive signal line 23a, a drive signal $\Phi TX$ output from the vertical scanning circuit 21 is provided to the transfer transistors TX. The gates of the reset transistors RES at the pixels in each row are connected to the drive signal line 23c corresponding to the particular row. Through the drive signal line 23c, a drive signal $\Phi RST$ output from the vertical scanning circuit 21 is provided to the reset transistors RES. The gates of the selector transistors SEL at the pixels in each row are connected to the drive signal line 23b corresponding to the particular row. Through the drive signal line 23b, a drive signal $\Phi SEL$ output from the vertical scanning circuit 21 is provided to the selector transistors SEL.

The photodiode PD generates a signal charge in correspondence to the amount of incoming light (subject light) entering therein. The transfer transistor TX remains in an ON state while the drive signal $\Phi TX$ sustains the H level, so as to transfer the signal charge accumulated at the photodiode PD to the floating diffusion FD. The reset transistor RES remains on while the drive signal $\Phi RST$ sustains the H level so as to reset the floating diffusion FD.

The amplifier transistor AMP, with its drain connected to the source voltage Vdd, its gate connected to the floating diffusion FD and its source connected to the drain of the selector transistor SEL, forms a source follower circuit that uses the constant current source 29 as its load. The amplifier transistor AMP outputs a read current corresponding to the value of the voltage at the floating diffusion FD, to the corresponding vertical signal line 28 via the selector transistor SEL. The selector transistor SEL remains on while the drive signal $\Phi SEL$ sustains the H level, so as to connect the source of the amplifier transistor AMP to the vertical signal line 28.

In response to a drive pulse (not shown) provided from the imaging control unit 4, the vertical scanning circuit 21 outputs the drive signals $\Phi SEL$, $\Phi RST$ and $\Phi TX$ to each row of pixels 20 so as to select a specific row of pixels 20. The horizontal scanning circuit 22 outputs drive signals $\Phi H1 \sim \Phi H8$, $\Phi G1 \sim \Phi G3$ and $\Phi R$ in response to a drive pulse (not shown) provided from the imaging control unit 4 so as to select a specific column of pixels 20 by controlling the front-stage switches 31 and select either the column A/D conversion or the horizontal A/D conversion as the A/D conversion method by controlling the rear-stage switches 32a~32c and the output switches 36a and 36b.

Figure 4:
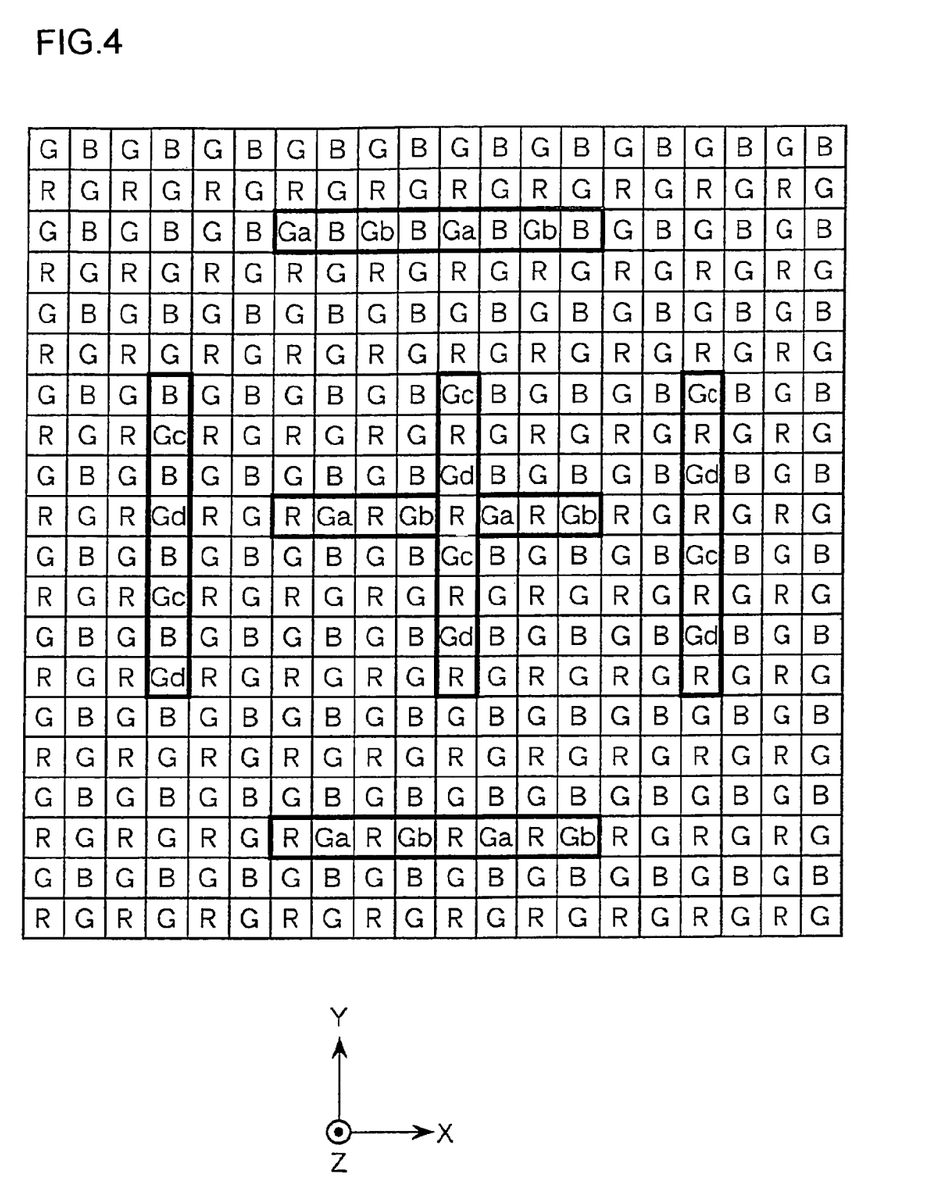
FIG. 4 is a schematic plan view of the effective pixel area in the solid-state image sensor in FIG. 1.

FIG. 4 is a schematic plan view showing the effective pixel area of the solid-state image sensor 3 in FIG. 1. For purposes of simplification, it is assumed that the effective pixel area contains 20×20 pixels 20, as shown in FIG. 4. FIG. 4 indicates ranges of pixels corresponding to the focus detection areas preset within the photographic field (within the plane of the image formed through the photographic lens 2) by enclosing them inside bold frames. As shown in FIG. 4, the AF pixels 20a~20d are disposed in the effective pixel area at the solid-state image sensor 3, over two focus detection areas set at the center of the effective pixel area and intersecting each other in a cross shape, two focus detection areas set on the left side and the right side and each ranging vertically and two focus detection areas set on the top side and the bottom side and each ranging horizontally, as shown in FIG. 4 in the embodiment. The AF pixels 20a and 20b are disposed in the focus detection areas ranging in rows, whereas the AF pixels 20c and 20d are disposed in the focus detection areas ranging in columns. For photographing operation or live view display, one of the focus detection areas is selected as the focus adjustment target in the electronic camera 1. Based upon the focus detection signals output from the AF pixels disposed within the range corresponding to the selected focus detection area, the focusing state of the photographic lens 2 is detected and focus adjustment is executed accordingly. It is to be noted that an X-axis, a Y-axis and a Z-axis extending perpendicular to one another are defined as shown in FIG. 4. A plane ranging parallel to the XY plane is aligned with the imaging surface (light-receiving surface) of the solid-state image sensor 3. The pixels are set side-by-side in rows that extend along the X-axis and in columns that extend along the Y-axis. It is to be noted that the incoming light enters from above the drawing sheet on which FIG. 3 is drawn and advances downward into the figure. This arrangement also applies to later drawings.

Color filters disposed in a Bayer array are each mounted at one of the pixels 20 in the embodiment. It is to be noted that the color filters may be disposed in an array other than the Bayer array. The colors of the color filters disposed at the pixels are indicated as R, G and B in FIG. 4. R indicates red, G indicates green and B indicates blue. In addition, the pixels at the solid-state image sensor 3 are categorized into one type of imaging pixels 20e and four types of AF pixels 20a, 20b, 20c and 20d, without using the colors of the color filters at the pixels as a determining factor. While the AF pixels 20a, 20b, 20c and 20d are respectively appended with letters a, b, c and d in FIGS. 2 and 4, the imaging pixels 20e, are not appended with a letter. Accordingly, "R" in FIGS. 2 and 4 indicates an imaging pixel 20e having a red color filter mounted thereat, whereas "Ga" in FIGS. 2 and 4 indicate an AF pixel 20a having a green color filter mounted thereat.

The AF pixels 20a indicated as "Ga" and the AF pixels 20b indicated as "Gb" in FIG. 4 both correspond to green. Within a given row, an AF pixel 20a and an AF pixel 20b are disposed alternately with an imaging pixel 20e indicated as "R" or "B", i.e., an imaging pixel 20e corresponding to red or blue, disposed between them in a reiterative pattern. In addition, the AF pixels 20c indicated as "Gc" and the AF pixels 20d indicated as "Gd" both correspond to green. Within a given column, an AF pixel 20c and an AF pixel 20d are disposed alternately with an imaging pixel 20e indicated as "R" or "B", i.e., an imaging pixel 20e corresponding to red or blue, disposed between them in a reiterative pattern.

It is to be noted that while FIG. 4 shows AF pixels 20a and 20b alternately disposed with a single imaging pixel 20e present between them and AF pixels 20c and 20d alternately disposed with a single imaging pixel 20e present between them, two or more imaging pixels may be present between the pair of AF pixels 20a and 20b or 20c and 20d. Namely, AF pixels 20a and 20b or 20c and 20d should be disposed alternately with at least one imaging pixel 20e between each pair of AF pixels at the solid-state image sensor 3.

Figure 5A:
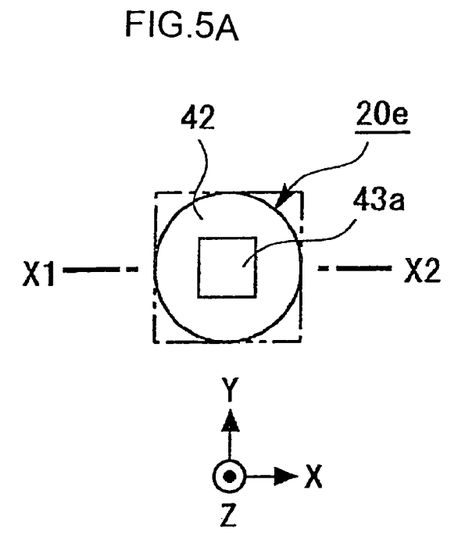
FIGS. 5A and 5B schematically illustrate the essential structure of an imaging pixel.
Figure 5B:
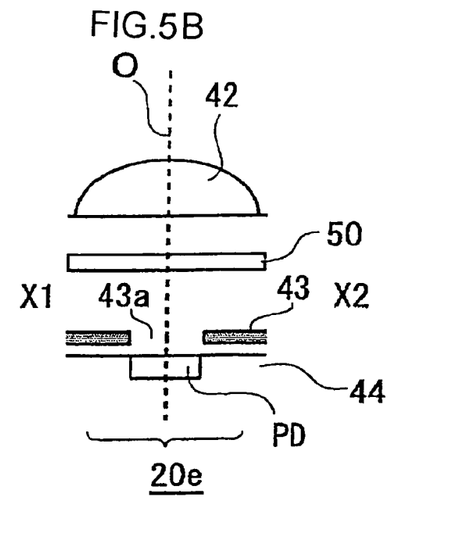

FIG. 5A is a schematic plan view showing the essential structure of an imaging pixel 20e, whereas FIG. 5B is a schematic sectional view taken along line X1-X2 in FIG. 5A.

The imaging pixel 20e includes the photodiode PD functioning as the photoelectric conversion unit, a micro-lens 42 disposed through on-chip formation over the photodiode PD and a color filter 50 in R (red), G (green) or B (blue), which is disposed on the side where the light enters the photodiode PD. In addition, as shown in FIG. 5B, a light shield layer 43, constituted with a metal layer or the like, is formed substantially over the focal plane of the micro-lens 42. The light shield layer 43 may also function as a wiring layer as needed. A square opening 43a, concentric with an optical axis O of the micro-lens 42, is formed at the light shield layer 43 of the imaging pixel 20e. The photodiode PD of the imaging pixel 20e assumes a size that allows it to effectively receive all the light having passed through the opening 43a. It is to be noted that an inter-layer insulating film and the like are formed between the light shield layer 43 and the micro-lens 42 and between a substrate 44 and the light shield layer 43.

The imaging pixel 20e in the embodiment includes the light shield layer 43 disposed substantially at the focal plane of the micro-lens 42, with the opening 43a formed at the light shield layer 43. Thus, a light flux departing an area of the exit pupil of the photographic lens 2, which is not substantially offset from the center of the exit pupil is received and undergoes photoelectric conversion at the photodiode PD of the imaging pixel 20e. It is to be noted that this area of the exit pupil corresponds to the image of the opening 43a projected via the micro-lens 42.

Figure 6A:
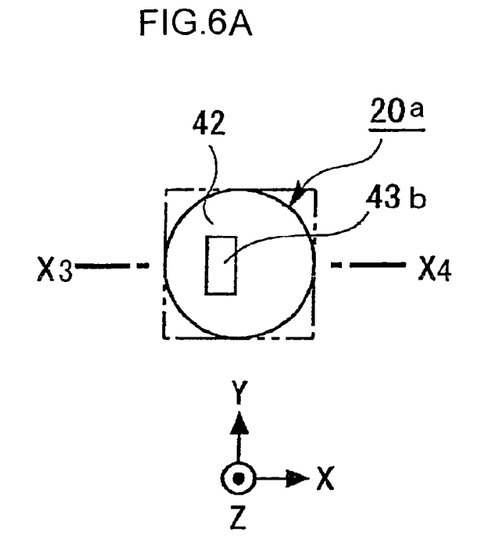
FIGS. 6A and 6B schematically illustrate the essential structure of an AF pixel.
Figure 6B:
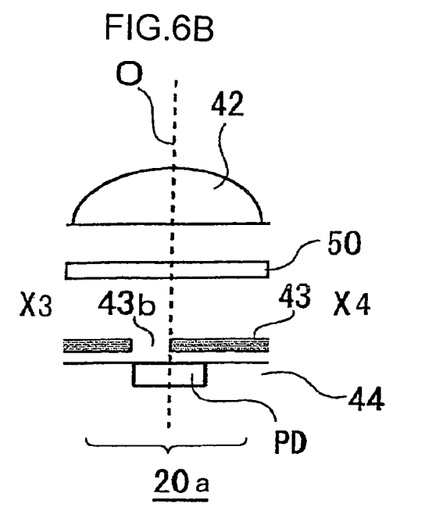

FIG. 6A is a schematic plan view showing the essential structure of an AF pixel 20a, whereas FIG. 6B is a schematic sectional view taken along line X3-X4 in FIG. 6A. In FIGS. 6A and 6B, the same reference numerals are assigned to elements identical to or corresponding to elements shown in FIGS. 5A and 5B. The elements assigned with the same reference numerals to those in FIGS. 5A and 5B are not repeatedly explained. This principle also applies in the description given in reference to FIGS. 7A, 7B, 8A, 8B, 9A and 9B.

The AF pixel 20a differs from the imaging pixel 20e only in that a rectangular opening 43b, ranging over an area that substantially matches the left half (on the −X side) of a square concentric with the optical axis O of the micro-lens 42 at the AF pixel 20a (a square with a size equal to that of the opening 43a), is formed at the light shield layer 43 of the AF pixel 20a. It is to be noted that the size of the photodiode PD at the AF pixel 20a is the same as the size of the photodiode PD at the imaging pixel 20e. While the opening 43b ranges over an area half the area of the opening 43a in the embodiment described above, the present invention is not limited to this example. For instance, the opening 43b may be a rectangular opening ranging over an area accounting for approximately 40% or 60% of the left half (the −X side) of the square concentric with the optical axis O of the micro-lens 42 of the AF pixel 20a (the square ranging over the area equal to the area of the opening 43a). It is desirable that the opening 43b at the AF pixel 20a range over an area equal to the area of an opening 43c at the AF pixel 20b to be described in detail later and that an opening 43d of each AF pixel 20c to be detailed later assume a size equal to that of an opening 43e at each AF pixel 20d to be detailed later.

The opening 43b is formed at the light shield layer 43 at a position on the −X side of the AF pixel 20a. Thus, a light flux departing an area of the exit pupil of the photographic lens 2 offset along the +X direction relative to the center of the exit pupil is selectively received and undergoes photoelectric conversion at the photodiode PD of the AF pixel 20a.

Figure 7A:
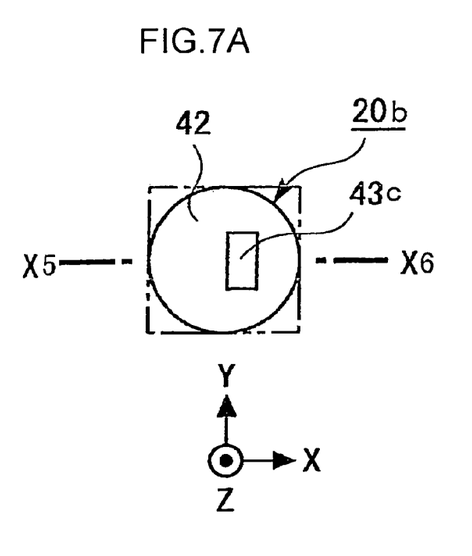
FIGS. 7A and 7B schematically illustrate the essential structure of an AF pixel which is of a different type from those shown in FIGS. 6A and 6B.
Figure 7B:
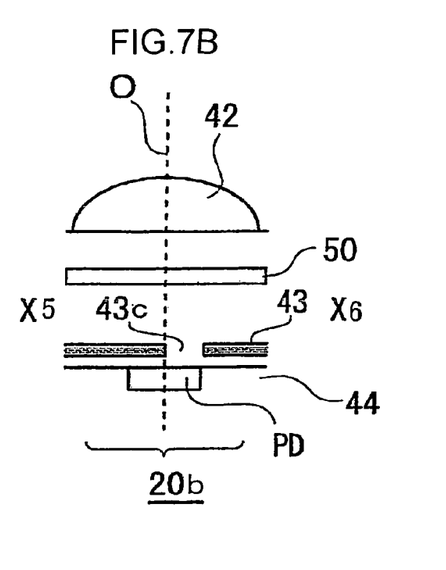

FIG. 7A is a schematic plan view showing the essential structure of an AF pixel 20b, whereas FIG. 7B is a schematic sectional view taken along line X5-X6 in FIG. 7A. The AF pixel 20b differs from the imaging pixel 20e only in that a rectangular opening 43c ranging over an area that substantially matches the right half (on the +X side) of a square concentric with the optical axis O of the micro-lens 42 at the AF pixel 20b (a square with a size equal to that of the opening 43a) is formed at the light shield layer 43 of the AF pixel 20b. Thus, a light flux departing an area of the exit pupil offset along the −X direction relative to the center of the exit pupil of the photographic lens 2 is selectively received and undergoes photoelectric conversion at the photodiode PD of the AF pixel 20b.

Figure 8A:
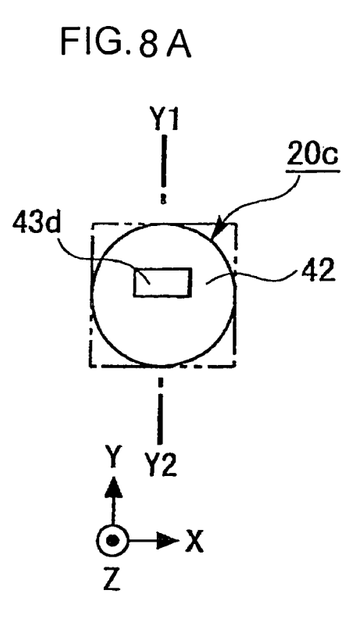
FIGS. 8A and 8B schematically illustrate the essential structure of an AF pixel which is of a different type from those shown in FIGS. 6A and 6B and 7A and 7B.
Figure 8B:
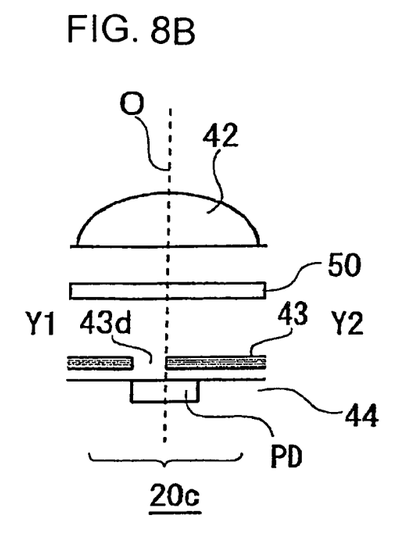

FIG. 8A is a schematic plan view showing the essential structure of an AF pixel 20c, whereas FIG. 8B is a schematic sectional view taken along line Y1-Y2 in FIG. 8A. The AF pixel 20c differs from the imaging pixel 20e only in that a rectangular opening 43d ranging over an area that substantially matches the upper half (on the +Y side) of a square concentric with the optical axis O of the micro-lens 42 at the AF pixel 20c (a square with a size equal to that of the opening 43a) is formed at the light shield layer 43 of the AF pixel 20c. Thus, a light flux departing an area of the exit pupil of the photographic lens 2 offset along the −Y direction relative to the center of the exit pupil is selectively received and undergoes photoelectric conversion at the photodiode PD of the AF pixel 20c.

Figure 9A:
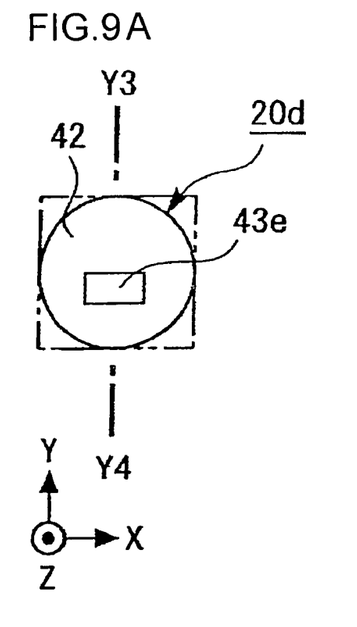
FIGS. 9A and 9B schematically illustrate the essential structure of an AF pixel which is of a different type from those shown in FIGS. 6A through 8B.
Figure 9B:
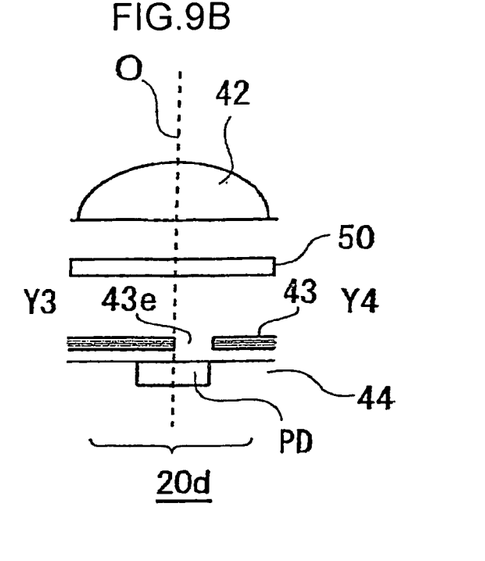

FIG. 9A is a schematic plan view showing the essential structure of an AF pixel 20d, whereas FIG. 9B is a schematic sectional view taken along line Y3-Y4 in FIG. 9A. The AF pixel 20d differs from the imaging pixel 20e only in that a rectangular opening 43e ranging over an area that substantially matches the lower half (on the −Y side) of a square concentric with the optical axis O of the micro-lens 42 at the AF pixel 20d (a square with a size equal to that of the opening 43a) is formed at the light shield layer 43 of the AF pixel 20d. Thus, a light flux departing an area of the exit pupil of the photographic lens 2 offset along the +Y direction relative to the center of the exit pupil is selectively received and undergoes photoelectric conversion at the photodiode PD of the AF pixel 20d.

As explained above, the AF pixel 20a, 20b, 20c and 20d execute photoelectric conversion on light fluxes having passed through different areas of the exit pupil of the photographic lens 2 and received thereat. The AF pixels then output focus detection signals. It is to be noted that the area over which the light flux is received at the AF pixel 20a and the area over which the light flux is received at the AF pixel 20b assume a left/right positional relationship relative to the exit pupil of the photographic lens 2. The area over which the light flux is received at the AF pixel 20c and the area over which the light flux is received at the AF pixel 20d assume an up/down positional relationship relative to the exit pupil of the photographic lens 2.

Figure 10:
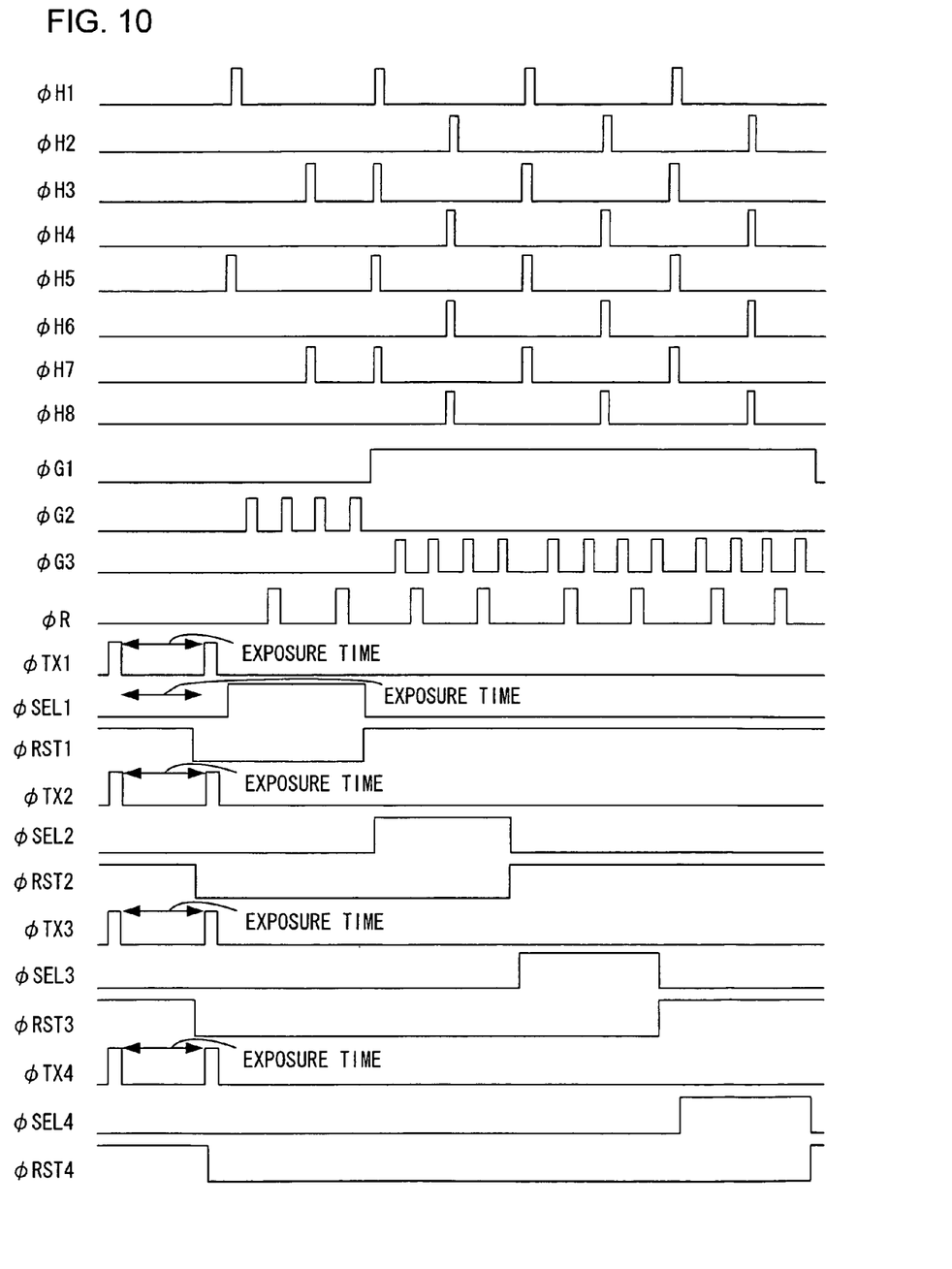
FIG. 10 is a timing chart presenting examples of drive signals that may be output when reading on imaging signals and focus detection signals from the solid-state image sensor.

FIG. 10 is a timing chart presenting examples of the individual drive signals output from the vertical scanning circuit 21 and the horizontal scanning circuit 22 to read out the imaging signals and focus detection signals from the solid-state image sensor 3. It is to be noted that while the following description is given in reference to a given group made up with eight columns of pixels 20 as shown in FIG. 2, the solid-state image sensor 3 actually includes numerous groups each assuming a similar circuit structure, as explained earlier.

First, the vertical scanning circuit 21 outputs pulsed H level signals ΦTX1~ΦTX4. In response, exposure starts at the individual pixels 20 and electrical charges corresponding to the amounts of received light are stored into their photodiodes PD. Once a predetermined length of exposure time elapses, the vertical scanning circuit 21 shifts ΦRST1~ΦRST4 from H level to L level and then again outputs pulsed H level signals ΦTX1~ΦTX4. In response, the exposure ends at the individual pixels 20 and the electrical charges having been stored in the photodiodes PD are transferred into the floating diffusions FD.

Once the exposure at the pixels 20 ends, the vertical scanning circuit 21 shifts ΦSEL1 from L level to H level, thereby selecting the first row of pixels 20.

As the first row of pixels 20 is selected by the vertical scanning circuit 21, the horizontal scanning circuit 22 outputs pulsed H level signals ΦH1 and ΦH5 to turn on the corresponding front-stage switches 31, thereby selecting the first column and the fifth column of pixels 20. As a result, the AF pixel 20a assuming the first row/first column position and the AF pixel 20a assuming the first row/fifth column position are selected at the same time.

Subsequently, the horizontal scanning circuit 22 outputs a pulsed H level signal ΦG2, thereby turning on the rear-stage switch 32c and the output switch 36b. Consequently, the focus detection signals from the two AF pixels 20a having been selected at the same time, as described above, are combined through group internal horizontal pixel summing, the composite signal is converted to a digital signal at the horizontal A/D conversion circuit 38 and the digital signal is output from the solid-state image sensor 3. It is to be noted that group-to-group horizontal pixel summing may be further executed at this time. Once the focus detection signal is output, the horizontal scanning circuit 22 outputs a pulsed H level signal ΦR and then outputs a pulsed H level signal ΦG2. In response, the output voltage is reset to the reference voltage Vref and the signal at the reference voltage Vref is output from the solid-state image sensor 3. The noise component can be eliminated by comparing this signal with the focus detection signal having been output earlier. It is to be noted that the signal at the reference voltage Vref may be output from the solid-state image sensor 3 before outputting the focus detection signal.

Next, the horizontal scanning circuit 22 outputs pulsed H level signals ΦH3 and ΦH7 to turn on the corresponding front-stage switches 31, thereby selecting the third column and the seventh column of pixels 20. As a result, the AF pixel 20b assuming the first row/third column position and the AF pixel 20b assuming the first row/seventh column position are selected at the same time.

Subsequently, the horizontal scanning circuit 22 outputs a pulsed H level signal ΦG2, thereby turning on the rear-stage switch 32c and the output switch 36b, as explained earlier. Consequently, the focus detection signals from the two AF pixels 20b having been selected at the same time, as described above, are combined through group internal horizontal pixel summing, and composite focus detection signal is converted to a digital signal at the horizontal A/D conversion circuit 38 and the resulting digital signal is output from the solid-state image sensor 3. It is to be noted that group-to-group horizontal pixel summing may be further executed at this time. Once the focus detection signal is output, the horizontal scanning circuit 22 outputs a pulsed H level signal ΦR and then outputs a pulsed H level signal ΦG2. In response, the output voltage is reset to the reference voltage Vref and the signal to be used for the noise component removal, similar to that described earlier, is output from the solid-state image sensor 3.

As described above, two AF pixels 20a are selected simultaneously and then two AF pixels 20b are selected simultaneously in the first row of pixels 20. The focus detection signals from the two AF pixels 20a having been selected are combined together and the composite focus detection signal is output from the solid-state image sensor 3. The focus detection signals from the two AF pixels 20b having been selected are also combined together and the composite focus detection signal is output from the solid-state image sensor 3. It is to be noted that a pair of AF pixels 20a and a pair of AF pixels 20b are disposed within the same row and the two pixels in each pair are selected together in the example described above. However, greater numbers of AF pixels may be disposed within the same row. In such a case, more than two AF pixels of a given type disposed in the row can be selected simultaneously.

Once the focus detection signals from the AF pixels 20a and 20b are output, the vertical scanning circuit 21 shifts ΦSEL1 from H level to L level and also shifts ΦRST1 from L level to H level, thereby clearing the selection of the first row. Subsequently, ΦSEL2 is shifted from L level to H level so as to select the second row of pixels 20.

As the second row of pixels 20 is selected by the vertical scanning circuit 21, the horizontal scanning circuit 22 shifts ΦG1 from L level to H level to turn on the rear-stage switch 32a and then outputs pulsed H level signals ΦH1, ΦH3, ΦH5 and ΦH7. As a result, the corresponding front-stage switches 31 are turned on and the first, third, fifth and seventh columns of pixels 20 are selected. The four imaging pixels 20e assuming the second row/first column position, the second row/third column position, the second row/fifth column position and the second row/seventh column position are thus selected at once. As shown in FIG. 2, these four imaging pixels 20e all correspond to R (red).

Subsequently, the horizontal scanning circuit 22 outputs a pulsed H level signal ΦG3, thereby turning on the rear-stage switch 32b and the output switch 36a. Consequently, the imaging signals from the four imaging pixels 20e having been selected at the same time, as described above, are combined through group internal horizontal pixel summing, the composite signal is converted to a digital signal at the column A/D conversion circuit 34 and the digital signal is output from the solid-state image sensor 3. Once the imaging signal is output, the horizontal scanning circuit 22 outputs a pulsed H level signal ΦR and then outputs a pulsed H level signal ΦG3. In response, the output voltage is reset to the reference voltage Vref and the signal at the reference voltage Vref is output from the solid-state image sensor 3. The noise component can be eliminated by comparing this signal with the imaging signal having been output earlier. It is to be noted that the signal at the reference voltage Vref may be output from the solid-state image sensor 3 before outputting the imaging signal.

Next, the horizontal scanning circuit 22 outputs pulsed H level signals ΦH2, ΦH4, ΦH6 and ΦH8. The corresponding front-stage switches 31 are turned on in response, thereby selecting the second, fourth, sixth and eighth columns of pixels 20. As a result, the four imaging pixels 20e assuming the second row/second column position, the second row/fourth column position, the second row/sixth column position and the second row/eighth column position are selected at the same time. As indicated in FIG. 2, these four imaging pixels 20e all correspond to G (green).

Subsequently, the horizontal scanning circuit 22 outputs a pulsed H level signal ΦG3, thereby turning on the rear-stage switch 32b and the output switch 36a, as explained above. Consequently, the imaging signals from the four imaging pixels 20e having been selected at the same time, as described above, are combined through group internal horizontal pixel summing, the composite signal is converted to a digital signal at the column A/D conversion circuit 34 and the digital signal is output from the solid-state image sensor 3. Once the imaging signal is output, the horizontal scanning circuit 22 outputs a pulsed H level signal ΦR and then outputs a pulsed H level signal ΦG3. In response, the output voltage is reset to the reference voltage Vref and the signal to be used for the noise component removal similar to that described earlier, is output from the solid-state image sensor 3.

As explained above, four imaging pixels 20e corresponding to a single color are selected at once in the second row of pixels 20 and the imaging signals from these four imaging pixels 20e are combined together and output as a composite signal from the solid-state image sensor 3.

Once the imaging signals from the imaging pixels 20e are output, the vertical scanning circuit 21 shifts ΦSEL2 from H level to L level and also shifts ΦRST2 from L level to H level, thereby clearing the selection of the second row.

After clearing the selection of the second row as described above, signals similar to those output for the second row are individually output for the third row and the fourth row from the vertical scanning circuit 21 and the horizontal scanning circuit 22. Namely, the vertical scanning circuit 21 shifts ΦSEL3 from L level to H level, thereby selecting the third row of pixels 20. Then, the horizontal scanning circuit 22 outputs pulsed H level signals ΦH1, ΦH3, ΦH5 and ΦH7 to select the first, third, fifth and seventh columns of pixels 20 and outputs a pulsed H level signal as ΦG3, thereby simultaneously selecting the four imaging pixels 20e corresponding to G (green). Next, the horizontal scanning circuit outputs a pulsed H level signals ΦH2, ΦH4, ΦH6 and ΦH8 to select the second, fourth, sixth and eighth columns of pixels 20 and outputs a pulsed H level signal as ΦG3, thereby simultaneously selecting the four imaging pixels 20e corresponding to B (blue). Once the imaging signals from the imaging pixels 20e in the third row are output, the vertical scanning circuit 21 shifts ΦSEL3 from H level to L level and shifts ΦRST3 from L level to H level, thereby clearing the selection of the third row.

Subsequently, the vertical scanning circuit 21 shifts ΦSEL4 from L level to H level, thereby selecting the fourth row of pixels 20. Then, the horizontal scanning circuit 22 outputs pulsed H level signals ΦH1, ΦH3, ΦH5 and ΦH7 to select the first, third, fifth and seventh columns of pixels 20 and outputs a pulsed H level signal as ΦG3, thereby simultaneously selecting the four imaging pixels 20e corresponding to R (red). Next, the horizontal scanning circuit outputs pulsed H level signals ΦH2, ΦH4, ΦH6 and ΦH8 to select the second, fourth, sixth and eighth columns of pixels 20 and outputs a pulsed H level signal as ΦG3, thereby simultaneously selecting the four imaging pixels 20e corresponding to G (green). Once the imaging signals from the imaging pixels 20e in the fourth row are output, the vertical scanning circuit 21 shifts ΦSEL4 from H level to L level and shifts ΦRST4 from L level to H level, thereby clearing the selection of the fourth row.

It is to be noted that the horizontal scanning circuit 22 selects different columns of pixels simultaneously, when the first row of pixels 20 where the AF pixels 20a and the AF pixels 20b are disposed is selected by the vertical scanning circuit 21 or when the second through fourth rows of pixels 20 where no AF pixels are disposed are selected by the vertical scanning circuit 21. Namely, when the first row of pixels 20 is selected, the first column and the fifth column where the AF pixels 20a are disposed are selected at the same time and the third column and the seventh column where the AF pixels 20b are disposed are selected at the same time. When one of the second through fourth rows of pixels 20 is selected, on the other hand, the first, third, fifth and seventh columns, where the imaging pixels 20e corresponding to R (or G) are disposed, are selected at the same time and also the second, fourth, sixth and eighth columns where the imaging pixels 20e corresponding to G (or B) are disposed, are selected at the same time.

Thus, in the row where the AF pixels are disposed, the AF pixels receiving light fluxes having passed through the same area at the exit pupil of the photographic lens 2 are selected all at once and a composite focus detection signal is generated by combining the focus detection signals from the simultaneously selected AF pixels. In each of the rows where no AF pixels are arrayed, the imaging pixels corresponding to a given color are selected all at once and a composite imaging signal is generated by combining the imaging signals from the simultaneously selected imaging pixels.

Following the exposure, the first through fourth rows of pixels 20 are individually selected at the solid-state image sensor 3, as described above, to readout imaging signals and focus detection signals from the solid-state image sensor 3. By executing reading of the imaging signal and focus detection signal at a predetermined frame rate, focus adjustment for the photographic lens 2 can be executed while providing, for instance, a live view display at the electronic camera 1. Namely, the live view display can be provided by displaying the motion picture of the subject image at the liquid crystal display unit 16 at the predetermined frame rate through processing executed by the display control unit 15, based upon the imaging signals read out from the solid-state image sensor 3. In addition, based upon the focus detection signals read out from the solid-state image sensor 3, the focus calculation unit 10 executes a specific type of processing to detect the focusing state of the photographic lens 2. Then, based upon the detection results indicating the focusing state, the lens control unit 2a executes focus adjustment for the photographic lens 2.

It is to be noted that the live view display may be provided at the electronic camera 1 by using the focus detection signals in addition to the imaging signals. In such a case, the composite focus detection signal generated by combining the signals from the two AF pixels 20a, as described earlier, and the composite focus detection signal generated by combining the signals from the two AF pixels 20b, as described earlier, may be further combined at the solid-state image sensor 3. The composite focus detection signal thus generated may be used as a substitute for an imaging signal corresponding to G (green) in the first row. During this process, the second column, the fourth column, the sixth column and the eighth column in the first row may be selected simultaneously via the vertical scanning circuit 21 and the horizontal scanning circuit 22 to read out the imaging signals corresponding to B (blue). Then, the display control unit 15 is able to execute processing based upon the imaging signals and the composite focus detection signal, so as to provide a live view display of the subject image formed through the photographic lens 2 at the liquid crystal display unit 16 at a predetermined frame rate.

An explanation is given above in reference to the embodiment on an example in which either the column A/D conversion or the horizontal A/D conversion is selected as the A/D conversion method when converting the analog signals from the pixels 20 to digital signals at the solid-state image sensor 3. However, the present invention may be adopted in a configuration that enables the execution of only either of these A/D conversion methods. It is to be noted that a configuration enabling the execution of the column A/D conversion alone does not require the output amplifier 37, the horizontal A/D conversion circuit 38, the wiring extending from the front-stage switches 31 to the horizontal signal line 35 via the rear-stage switch 32c, and the wiring branching out from the horizontal signal line 35 to the output switch 36b in FIG. 2. On the other hand, a configuration enabling execution of the horizontal A/D conversion alone does not require the column A/D conversion circuit 34, the wiring extending from the front-stage switches 31 to the horizontal signal line 35 via the rear-stage switches 32a and 32b and the column A/D conversion circuit 34, and the wiring branching from the horizontal signal line 35 to the output switch 36a. Neither configuration requires the rear-stage switches 32a~32c, the output switches 36a and 36b, and the drive signals ΦG1~ΦG3 to be output from the horizontal scanning circuit.

The following advantages are achieved through the embodiment.

(1) A plurality of pixels 20 are disposed in a two-dimensional array at the solid-state image sensor 3. The plurality of pixels 20 include AF pixels 20a at each of which a light flux having passed through an area of the exit pupil of the photographic lens 2, offset from the center of the exit pupil along the +X direction, is received and AF pixels 20b at each of which a light flux having passed through an area of the exit pupil of the photographic lens 2, different from the area through which the light flux received at the AF pixel 20a passes and offset along the −X direction from the center of the exit pupil, is received, both to be used as AF pixels that output focus detection signals. At this solid-state image sensor 3, a plurality of AF pixels 20a and a plurality of AF pixels 20b disposed within a given row are individually selected at once via the vertical scanning circuit 21 and the horizontal scanning circuit 22 constituting peripheral circuits of the solid-state image sensor. Via other peripheral circuits at the solid-state image sensor 3, the focus detection signals from the plurality of AF pixels 20a selected via the vertical scanning circuit 21 and the horizontal scanning circuit 22 are combined and the resulting composite focus detection signal is output and the focus detection signals from the plurality of AF pixels 20b selected via the vertical scanning circuit 21 and the horizontal scanning circuit 22 are combined and the resulting composite focus detection signal is output. As a result, accurate focus detection can be executed while the live view is displayed at the electronic camera 1.

(2) The plurality of pixels 20 also include imaging pixels 20e that output imaging signals. Within a given row, an AF pixel 20a and an AF pixel 20b are alternately disposed with at least one imaging pixel 20e present between them. In addition, within a given column, an AF pixel 20c and an AF pixel 20d are alternately disposed with at least one imaging pixel 20e disposed between them. Thus, light fluxes can be received with precision through the photographic lens 2 at the AF pixels 20a and the AF pixels 20b and at the AF pixels 20c and the AF pixels 20d, and imaging signals can also be output from the row or the column containing the AF pixels.

(3) An AF pixel 20a corresponding to green and an AF pixel 20b corresponding to green are alternately disposed with an imaging pixel 20e corresponding to either red or blue disposed between them within a given row and an AF pixel 20c corresponding to green and an AF pixel 20d corresponding to green are alternately disposed with an imaging pixel 20e corresponding to either red or blue disposed between them at the image sensor described above. This structure allows the individual pixels, i.e., the AF pixels 20a~20d and the imaging pixels 20e, in the Bayer array constituted with the plurality of pixels 20 to assume the optimal positional arrangement.

(4) The pixel columns selected simultaneously by the horizontal scanning circuit 22 when the vertical scanning circuit 21 has selected a row with the AF pixels 20a and 20b disposed therein are different from the pixel columns selected simultaneously by the horizontal scanning circuit 22 when a row with no AF pixels disposed therein has been selected by the vertical scanning circuit 21. In other words, the AF pixels 20a and the AF pixels 20b are individually selected at once in the row with the AF pixels 20a and 20b disposed therein so as to generate composite focus detection signals. In a row with no AF pixels 20a or 20b disposed therein, imaging pixels 20e corresponding to a single color are selected together at the same time so as to generate a composite imaging signal.

(5) The area of the exit pupil of the photographic lens 2, through which the light flux is received at a given AF pixel 20a, and the area of the exit pupil of the photographic lens 2 through which a light flux is received at the AF pixel 20b, assume a left/right positional relationship relative to the exit pupil of the photographic lens 2. The area of the exit pupil of the photographic lens 2 through which a light flux is received at a given AF pixel 20c and the area of the exit pupil of the photographic lens 2, through which the light flux is received at the AF pixel 20d assume an up/down positional relationship relative to the exit pupil of the photographic lens 2. Thus, focus detection signals needed to accurately detect the focusing condition of the photographic lens 2 can be output from the individual AF pixels.

(6) A live view display of the subject image formed through the photographic lens 2 can be brought up via the display control unit 15 and the liquid crystal display unit 16 at the electronic camera 1, based upon composite signals, each generated via the peripheral circuits of the solid-state image sensor 3 by combining a composite focus detection signal originating from a plurality of AF pixels 20a and a composite focus detection signal originating from a plurality of AF pixels 20b. In other words, horizontal pixel summing similar to that executed for rows with no AF pixels disposed therein can be executed for a row with the AF pixels 20a and 20b disposed therein and the resulting signals can be used for the live view display.

While the invention has been particularly described with respect to an embodiment and variations thereof, the present invention is not limited to these examples. In addition, the operations executed by the vertical scanning circuit 21 and the horizontal scanning circuit 22 in the embodiment may be reversed. In other words, a plurality of AF pixels 20c disposed within a given column may be selected simultaneously, a plurality of AF pixels 20d disposed in the same row may be selected simultaneously and composite focus detection signals, each generated by combining the focus detection signals from the plurality of AF pixels 20c or the plurality of AF pixels 20d, may be output from the solid-state image sensor 3 via the vertical scanning circuit 21 and the horizontal scanning circuit 22. Through this process, too, accurate focus detection can be executed during live view display at the electronic camera 1 as in the embodiment described earlier.

What is claimed is:

1. A solid-state imaging device, comprising:
a plurality of pixels disposed in a two-dimensional array;
a scanning circuit that selects a specific pixel among the pixels by selecting a pixel row and a pixel column; and
a signal output circuit that outputs a signal from the pixel selected by the scanning circuit, wherein:
the plurality of pixels include a plurality of first focus detection pixels at each of which a light flux having passed through a first area of an exit pupil of an imaging optical system is received and a plurality of second focus detection pixels at each of which a light flux having passed through a second area of the exit pupil of the imaging optical system, different from the first area, is received, both used as focus detection pixels that output signals to be used to detect a focusing condition of the imaging optical system;
the first focus detection pixels and the second focus detection pixels are disposed within a single row or a single column;
the scanning circuit selects a plurality of first focus detection pixels disposed within the single row or column at once and a plurality of second focus detection pixels disposed within the single row or column at once; and
the signal output circuit combines signals from the plurality of first focus detection pixels selected by the scanning circuit and outputs a resulting composite signal, and also combines signals from the plurality of second focus detection pixels selected by the scanning circuit and outputs a resulting composite signal.

2. A solid-state imaging device according to claim 1, wherein:
the plurality of pixels also include imaging pixels that output signals to be used to capture an image formed through the imaging optical system; and
the first focus detection pixel and the second focus detection pixel are alternately disposed with at least one imaging pixel disposed therebetween within the single row or column.

3. A solid-state imaging device according to claim 2, wherein:
the pixels each correspond to a specific color among red, green and blue; and
a first focus detection pixel corresponding to green and a second focus detection pixel corresponding to green are alternately disposed with an imaging pixel corresponding to either red or blue disposed therebetween within the single row or column.

4. A solid-state imaging device according to claim 1, wherein:
the scanning circuit selects specific pixel columns simultaneously when it has selected a row having the first focus detection pixels and the second focus detection pixels disposed therein and also selects pixel columns that are different from the specific pixel columns simultaneously when it has selected a row with no first focus detection pixels or second focus detection pixels disposed therein.

5. A solid-state imaging device according to claim 1, wherein:
the scanning circuit selects specific pixel rows simultaneously when it has selected a column having the first focus detection pixels and the second focus detection pixels disposed therein and also selects pixel rows that are different from the specific pixel rows simultaneously when it has selected a column with no first focus detection pixels or second focus detection pixels disposed therein.

6. A solid-state imaging device according to claim 1, wherein:
the first area and the second area assume a left/right positional relationship or an up/down positional relationship relative to the exit pupil of the imaging optical system.

7. An electronic camera comprising a solid-state imaging device according to claim 1.

8. An electronic camera according to claim 7, further comprising:
a display means for bringing up a live view display of an image formed through the imaging optical system based upon a composite signal generated by further combining a composite signal of the signals from the plurality of first focus detection pixels having been combined via the signal output circuit and a composite signal of the signals from the plurality of second focus detection pixels having been combined via the signal output circuit.

* * * * *